(12) United States Patent
Scott et al.

(10) Patent No.: US 9,705,463 B2
(45) Date of Patent: Jul. 11, 2017

(54) HIGH EFFICIENCY RADIO FREQUENCY POWER AMPLIFIER CIRCUITRY WITH REDUCED DISTORTION

(71) Applicant: RF Micro Devices, Inc., Greensboro, NC (US)

(72) Inventors: Baker Scott, San Jose, CA (US);
George Maxim, Saratoga, CA (US);
Dirk Robert Walter Leipold, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 3 days.

(21) Appl. No.: 14/554,774

(22) Filed: Nov. 26, 2014

(65) Prior Publication Data
US 2015/0145604 A1    May 28, 2015

Related U.S. Application Data

(60) Provisional application No. 61/909,028, filed on Nov. 26, 2013.

(51) Int. Cl.
| H03F 3/30 | (2006.01) |
| H03F 1/02 | (2006.01) |
| H03F 3/21 | (2006.01) |
| H03F 3/19 | (2006.01) |
| H03G 3/30 | (2006.01) |

(Continued)

(52) U.S. Cl.
CPC ......... *H03G 3/3036* (2013.01); *H03F 1/0211* (2013.01); *H03F 1/0272* (2013.01); *H03F 1/223* (2013.01); *H03F 1/32* (2013.01); *H03F 1/523* (2013.01); *H03F 1/565* (2013.01); *H03F 3/19* (2013.01); *H03F 3/193* (2013.01); *H03F 3/45179* (2013.01); *H03F 3/45394* (2013.01); *H03F 3/68* (2013.01); *H04B 1/0475* (2013.01); *H03F 2200/324* (2013.01); *H03F 2200/387* (2013.01); *H03F 2200/451* (2013.01); *H03F 2200/471* (2013.01); *H03F 2201/3236* (2013.01); *H03G 3/3042* (2013.01);
(Continued)

(58) Field of Classification Search
USPC ......... 330/305, 310–311, 302, 285, 296–297
See application file for complete search history.

(56) References Cited

U.S. PATENT DOCUMENTS

| 8,416,023 B2 * | 4/2013 | van Rijs | H03F 1/0222 330/277 |
| 8,629,725 B2 * | 1/2014 | Scott | H03F 1/223 330/305 |

* cited by examiner

*Primary Examiner* — Hieu Nguyen
(74) *Attorney, Agent, or Firm* — Withrow & Terranova, P.L.L.C.

(57) ABSTRACT

Radio frequency power amplifier circuitry includes an amplifier element, power supply modulation circuitry, and bias modulation circuitry. The amplifier element is configured to amplify an RF input signal using a modulated power supply signal and a modulated bias signal to produce an RF output signal. The power supply modulation circuitry is coupled to the amplifier element and configured to provide the modulated power supply signal. The bias modulation circuitry is coupled to the amplifier element and the power supply modulation circuitry and configured to receive the modulated power supply signal and provide the modulated bias signal. Notably, the modulated bias signal is a function of the modulated power supply signal such that the modulated bias signal is configured to maintain a small signal gain of the amplifier element and the phase of the RF input signal at a constant value as the modulated power supply signal changes.

16 Claims, 17 Drawing Sheets

(51) Int. Cl.
*H03F 1/52* (2006.01)
*H04B 1/04* (2006.01)
*H03F 1/32* (2006.01)
*H03F 3/68* (2006.01)
*H03F 1/22* (2006.01)
*H03F 1/56* (2006.01)
*H03F 3/45* (2006.01)
*H03F 3/193* (2006.01)

(52) U.S. Cl.
CPC ............... *H04B 2001/0408* (2013.01); *H04B 2001/0416* (2013.01); *H04B 2001/0425* (2013.01)

HIGH EFFICIENCY RADIO FREQUENCY POWER AMPLIFIER CIRCUITRY WITH REDUCED DISTORTION

RELATED APPLICATIONS

This application claims the benefit of U.S. provisional patent application No. 61/909,028, filed Nov. 26, 2013, the disclosure of which is incorporated herein by reference in its entirety.

FIELD OF THE DISCLOSURE

The present disclosure is related to radio frequency (RF) power amplifier (PA) circuitry, and in particular, to RF PA circuitry configured to reduce distortion introduced via a modulation of a power supply signal provided to the RF PA circuitry.

BACKGROUND

Many radio frequency (RF) communications protocols rely upon amplitude modulation (AM) of an RF carrier signal to encode data therein. As RF communications protocols evolve, the required accuracy of this amplitude modulation continues to increase. For RF power amplifiers (PAs) used to amplify RF signals, the linearity of the RF PA determines its ability to accurately replicate the amplitude of an RF input signal to the radio frequency power amplifier in proportion to the gain of the radio frequency power amplifier. One way to increase the linearity of a radio frequency power amplifier is to increase a supply voltage provided thereto. Known in the industry as increasing a "headroom" of a radio frequency power amplifier, such an increase in linearity comes at the cost of efficiency, as additional power is expended due to an increase in the supply voltage. In order to increase the efficiency of radio frequency power amplifiers while simultaneously maintaining their linearity, many designers have turned to power supply modulation techniques such as envelope tracking. In general, envelope tracking maintains a minimum required voltage headroom for a radio frequency power amplifier in order to maintain the linearity of the radio frequency power amplifier over changes in the amplitude of an input signal. Because only the supply voltage necessary to maintain the linearity of a radio frequency power amplifier is used, envelope tracking results in significant increases in the efficiency of the radio frequency power amplifier when compared to a static supply voltage approach.

While envelope tracking often results in increased efficiency, modulating a supply voltage provided to a radio frequency power amplifier often results in changes in the gain response thereof. Specifically, the small signal gain of the radio frequency power amplifier will change depending on the provided supply voltage. Accordingly, the linearity of the radio frequency power amplifier will be significantly degraded when using envelope tracking power supply modulation, as discussed below.

FIG. 1 shows a basic configuration for a conventional RF PA circuitry 10 including power supply modulation circuitry 12. As shown in FIG. 1, the conventional RF PA circuitry 10 includes an amplifier stage 14 coupled to the power supply modulation circuitry 12. In operation, the amplifier stage 14 receives and amplifies an RF input signal RF_IN using the modulated power supply voltage M_VDD and the bias signal BIAS to provide an RF output signal RF_OUT. The power supply modulation circuitry 12 receives a power supply voltage VDD and provides the modulated power supply voltage M_VDD to the amplifier stage 14. Bias circuitry 16 provides the bias signal BIAS to the amplifier stage 14, which sets one or more operating parameters of the amplifier stage 14.

FIG. 2 shows the gain response of the conventional RF PA circuitry 10 for a variety of different power supply voltages VDD that may be provided by the power supply modulation circuitry 12 at a given time. In FIG. 1, the various power supply voltages VDD increase between VDD1 and VDD5. Notably, the small signal gain at various power supply voltages VDD diverges significantly between VDD1 and VDD4, which results in disruptions in the linearity of the conventional radio frequency power amplifier, also known as AM to AM distortion. Further, while the small signal gain between VDD4 and VDD5 remains relatively constant, the point at which gain compression and/or expansion begins varies significantly between these supply voltages.

In addition to the shortcomings of power supply modulation with respect to AM to AM distortion, power supply modulation can also result in significant changes to the phase of an RF signal provided to a radio frequency power amplifier. As shown in FIG. 3, the conventional RF PA circuitry 10 includes a number of parasitic capacitances C_P. As the modulated supply voltage M_VDD provided to the conventional RF PA circuitry 10 changes, the capacitive response of the parasitic capacitances also changes, resulting in changes to the phase of the RF signal RF_IN as it is passed through the conventional RF PA circuitry 10. FIG. 4 shows changes in the capacitance of the amplifier stage 14 for different supply voltages VDD provided thereto. As shown in FIG. 4, the input capacitance remains relatively constant for a particular input power range of the amplifier stage 14, then decreases sharply. While the variable capacitance of the amplifier stage 14 can often be compensated for in static supply voltage systems, the point at which the input capacitance decreases changes significantly with different supply voltages provided to the amplifier stage 14, making such compensation extremely difficult. As discussed above, these changes in the capacitance of the amplifier stage 14 result in significant changes to the phase of the RF signal RF_IN, also known as phase modulation (PM) to PM distortion and or AM to PM distortion.

Accordingly, there is a present need for RF PA circuitry configured to maintain a constant gain and phase response over a variety of power supply voltages such that the RF PA circuitry maintains low distortion levels when used with power supply modulation techniques.

SUMMARY

The present disclosure is related to radio frequency (RF) power amplifier (PA) circuitry, and in particular, to RF PA circuitry configured to reduce distortion introduced via modulation of a power supply signal provided to the RF PA circuitry. In one embodiment, RF PA circuitry includes an amplifier element, power supply modulation circuitry, and bias modulation circuitry. The amplifier element is configured to amplify an RF input signal using a modulated power supply signal and a modulated bias signal to produce an RF output signal. The power supply modulation circuitry is coupled to the amplifier element and configured to provide the modulated power supply signal. The bias modulation circuitry is coupled to the amplifier element and the power supply modulation circuitry and configured to receive the modulated power supply signal and provide the modulated bias signal. Notably, the modulated bias signal is a function of the modulated power supply signal such that the modulated bias signal is configured to maintain a small signal gain of the amplifier element at a constant value as the modulated power supply signal changes. By using the bias modulation circuitry to maintain the small signal gain of the amplifier element at a constant value, amplitude modulation (AM) to AM distortion present in the RF output signal can be reduced or eliminated, thereby improving the performance of the RF PA circuitry.

In one embodiment, RF PA circuitry includes an amplifier element, power supply modulation circuitry, and capacitance compensation circuitry. The amplifier element is configured to amplify an RF input signal using a modulated power supply signal to produce an RF output signal. The power supply modulation circuitry is configured to provide the modulated power supply signal. The capacitance compensation circuitry is coupled to the amplifier element and the power supply modulation circuitry and configured to receive the modulated power supply signal and present a compensation capacitance to the amplifier element. Notably, the compensation capacitance is a function of the modulated power supply signal such that the compensation capacitance is configured to compensate for changes in an internal capacitance of the amplifier element in order to maintain a phase of the RF output signal at a constant value as the modulated power supply signal changes. By using the capacitance compensation circuitry to maintain the phase of the RF output signal at a constant value, phase modulation (PM) to PM and/or AM to PM distortion present in the RF output signal can be reduced or eliminated, thereby improving the performance of the RF PA circuitry.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 1:
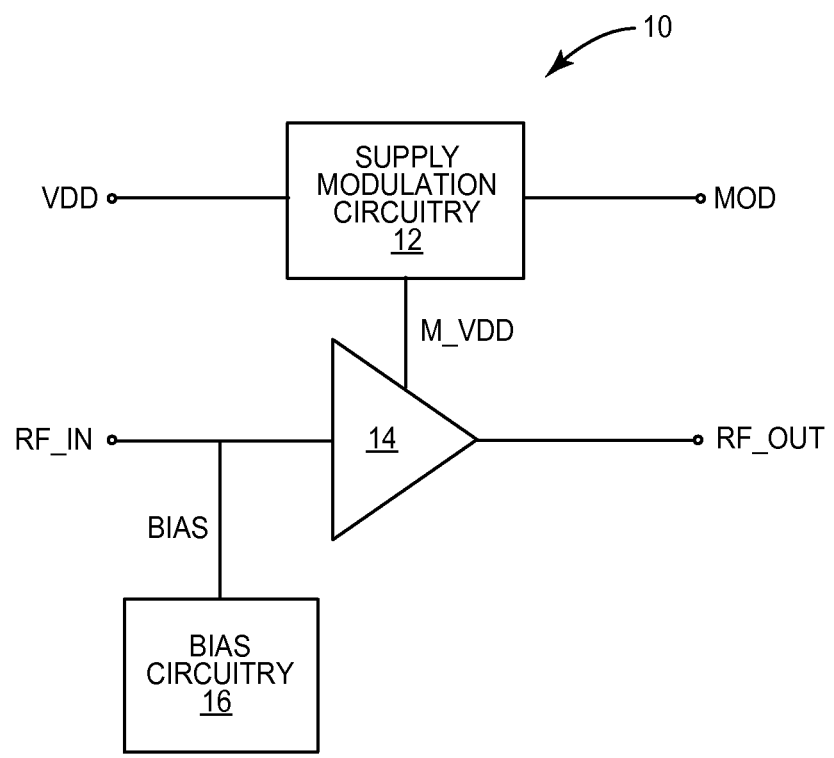
FIG. 1 is a schematic illustrating conventional radio frequency (RF) power amplifier (PA) circuitry including supply modulator circuitry.
Figure 2:
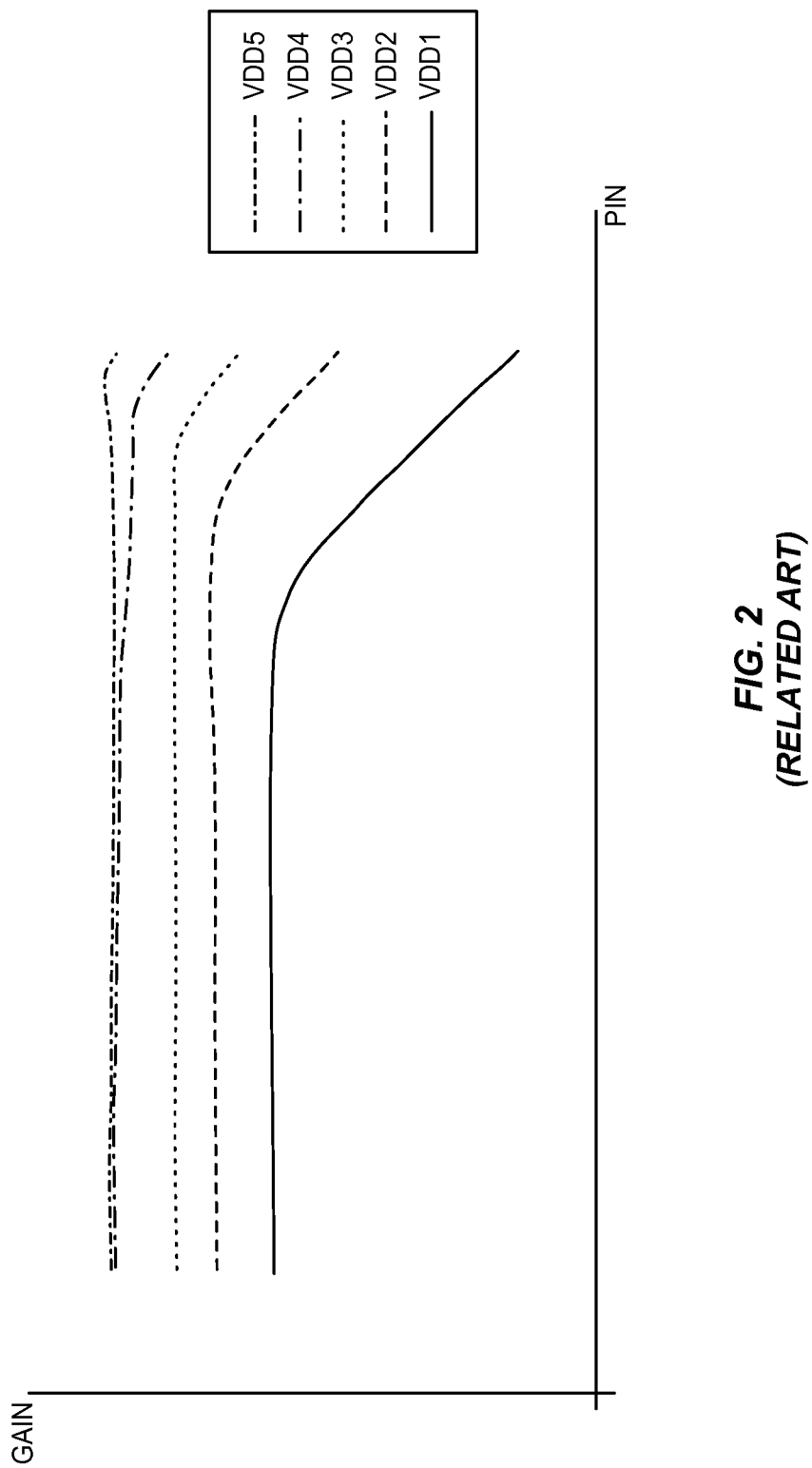
FIG. 2 is a graph illustrating the small signal gain variation experienced by the conventional RF PA circuitry due to modulation of the supply.
Figure 3:
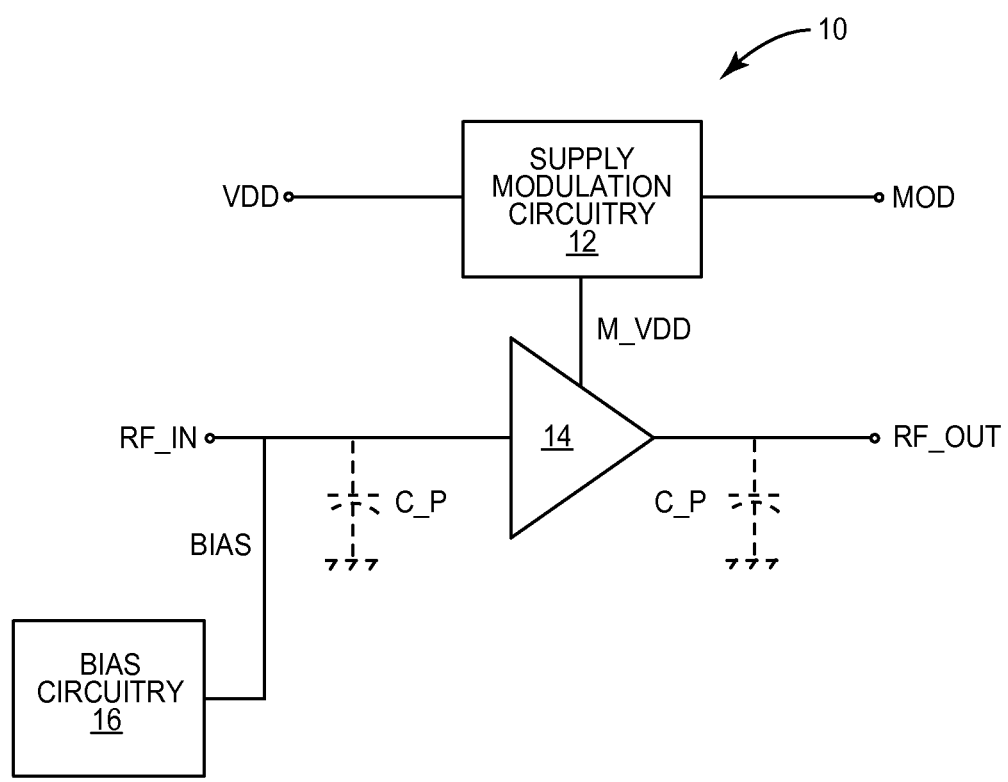
FIG. 3 is a schematic illustrating the conventional RF PA circuitry and one or more parasitic capacitances therein.
Figure 4:
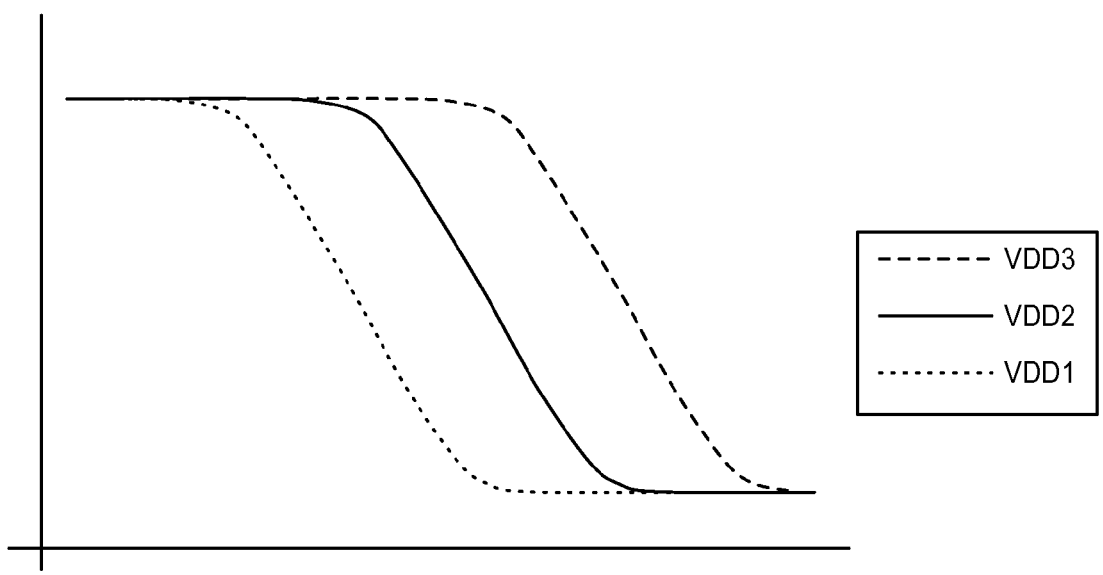
FIG. 4 is a graph illustrating changes in the parasitic capacitances of the RF PA circuitry due to modulation of the supply.
Figure 5:
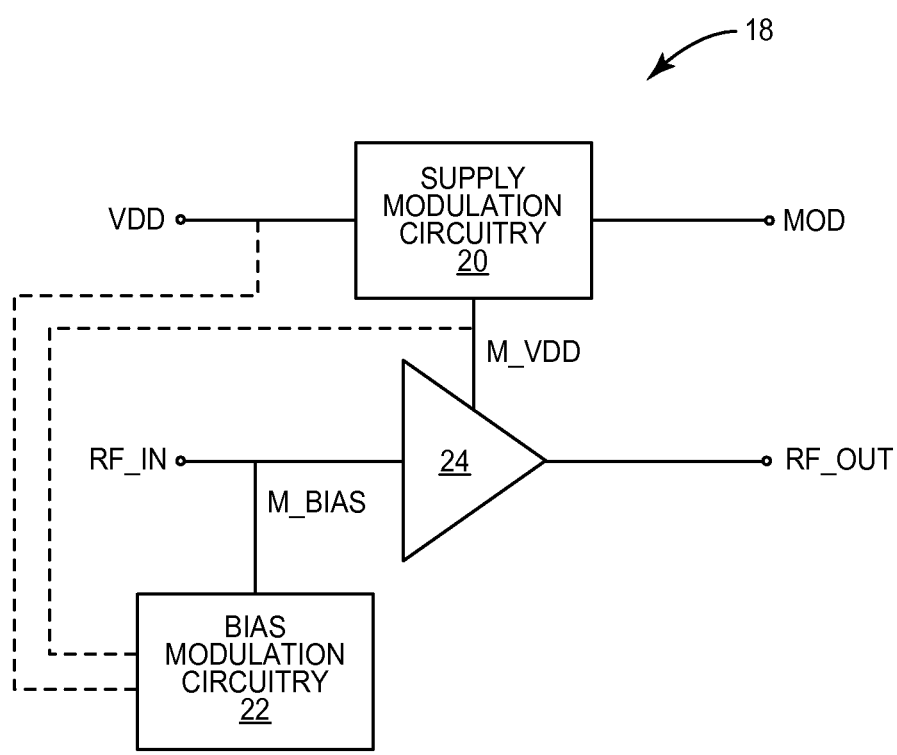
FIG. 5 is a schematic illustrating RF PA circuitry including supply modulator circuitry and bias modulation circuitry according to one embodiment of the present disclosure.

FIG. 5 shows radio frequency (RF) power amplifier (PA) circuitry 18 including power supply modulation circuitry 20 and bias modulation circuitry 22 according to one embodiment of the present disclosure. The RF PA circuitry 18 includes an amplifier stage 24, which may be any type of amplifier circuitry configured to receive and amplify an RF input signal RF_IN to provide an RF output signal RF_OUT. The power supply modulation circuitry 20 may receive a power supply voltage VDD and provide a modulated power supply voltage M_VDD to the amplifier stage 24 based on a baseband modulated control signal MOD. The bias modulation circuitry 22 may receive the power supply voltage VDD, the modulated power supply voltage M_VDD, or both, and provide a modulated bias signal M_BIAS to the amplifier stage 24 based thereon. In one embodiment, the bias modulation circuitry 22 may also receive the baseband modulated control signal MOD and provide the modulated bias signal M_BIAS based thereon. The amplifier stage 24 uses the modulated power supply voltage M_VDD to amplify the RF input signal RF_IN, while the modulated bias signal M_BIAS dynamically sets one or more operating parameters of the amplifier stage 24 such that the small signal gain of the amplifier stage 24 remains constant.

The power supply modulation circuitry 20 may modulate the power supply voltage VDD in any number of ways. For example, the power supply modulation circuitry 20 may modulate the power supply voltage VDD in an envelope supply modulation scheme wherein the modulated supply voltage M_VDD tracks an amplitude of the RF input signal RF_IN. As discussed above, modulating the power supply voltage VDD may result in changes in the small signal gain of the amplifier stage 24. Accordingly, regardless of the supply modulation scheme used by the power supply modulation circuitry 20, the bias modulation circuitry 22 modulates the modulated bias signal M_BIAS based on the modulated power supply voltage M_VDD, which dynamically sets one or more operating parameters of the amplifier stage 24 in order to maintain the small signal gain of the amplifier stage 24 at a constant level as the level of the modulated supply voltage M_VDD changes as discussed in further detail below.

Figure 6:
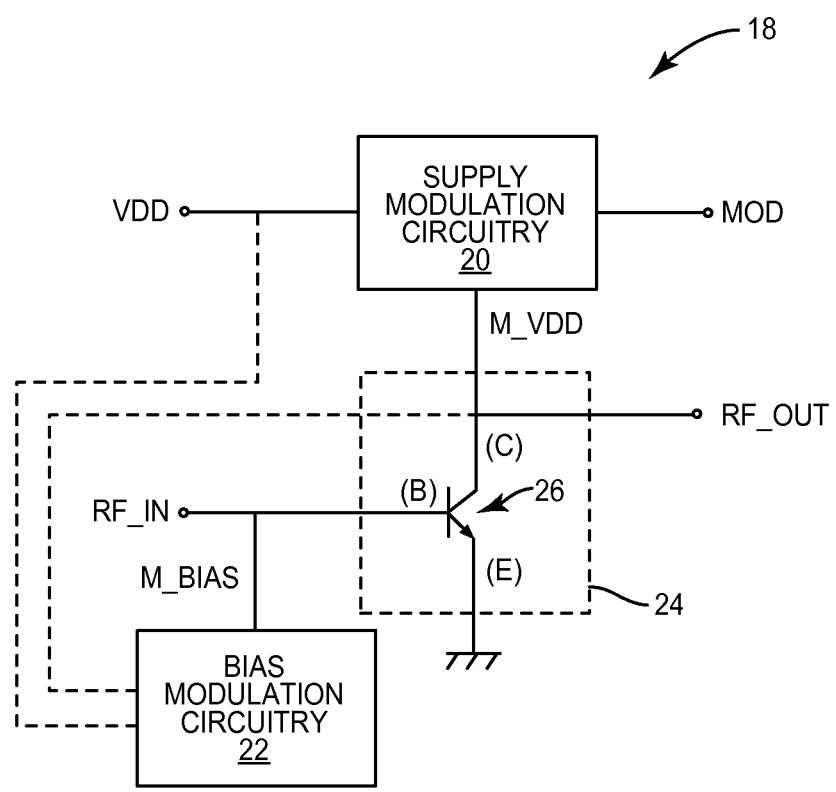
FIG. 6 is a schematic illustrating details of the RF PA circuitry shown in FIG. 5 according to one embodiment of the present disclosure.

FIG. 6 shows details of the amplifier stage 24 in the RF PA circuitry 18 according to one embodiment of the present disclosure. As shown in FIG. 6, the amplifier stage 24 is a transistor 26. In one embodiment, the transistor 26 is a bipolar junction transistor (BJT), however, any suitable transistor may be used without departing from the principles of the present disclosure. In the embodiment wherein the transistor 26 is a BJT, a base contact (B) of the transistor 26 is coupled to the bias modulation circuitry 22 and receives the RF input signal RF_IN and the modulated bias signal M_BIAS, a collector contact (C) of the transistor 26 is coupled to the power supply modulation circuitry 20 and receives the modulated supply voltage M_VDD and provides the RF output signal RF_OUT, and an emitter contact (E) of the transistor 26 is grounded. The RF PA circuitry 18 shown in FIG. 6 operates as described above, wherein the transistor 26 receives the RF input signal RF_IN and the modulated bias signal M_BIAS at the base contact (B) and provides an amplified RF output signal RF_OUT at the collector contact (C) using the modulated bias signal M_BIAS and the modulated power supply voltage M_VDD received at the collector contact (C).

Figure 7:
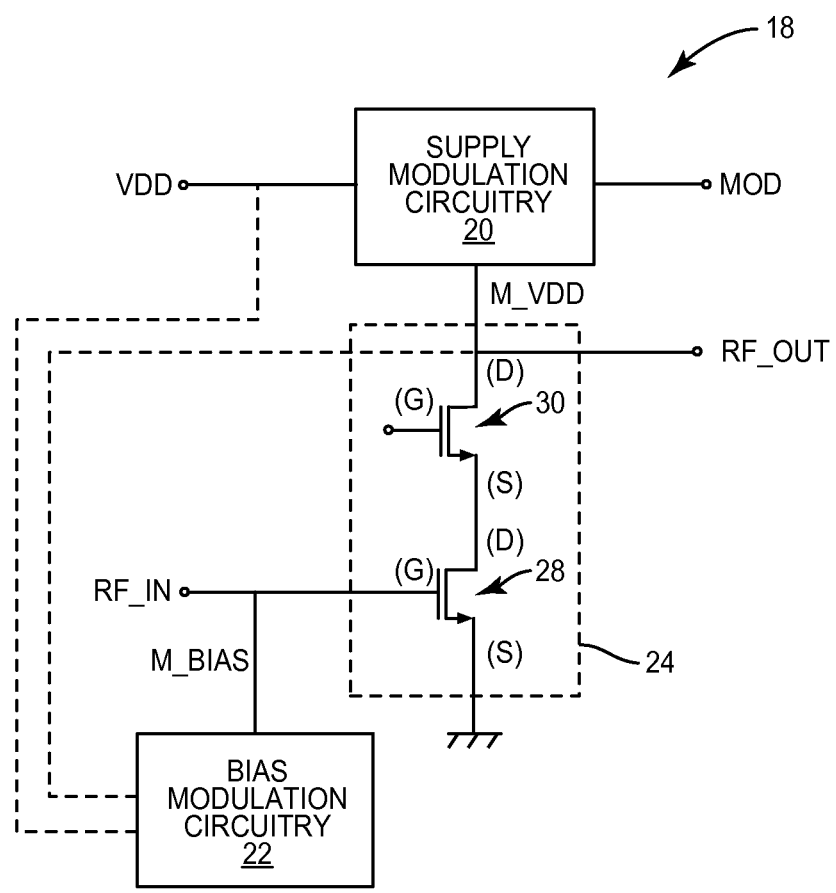
FIG. 7 is a schematic illustrating details of the RF PA circuitry shown in FIG. 5 according to an additional embodiment of the present disclosure.

FIG. 7 shows details of the amplifier stage 24 in the RF PA circuitry 18 according to an additional embodiment of the present disclosure. As shown in FIG. 7, the amplifier stage 24 includes a pair of transistors coupled in cascode. Although only two transistors are shown in FIG. 7, any number of transistors may be included in the amplifier stage 24 without departing from the principles of the present disclosure. In one embodiment, each one of the pair of transistors is a metal-oxide-semiconductor field-effect transistor (MOSFET), however, any suitable transistor components may be used without departing from the principles described herein. In the embodiment wherein the transistors are MOSFETs, the amplifier stage 24 includes a first transistor 28 including a gate contact (G) coupled to the bias modulation circuitry 22 and configured to receive the RF input signal RF_IN and the modulated bias signal M_BIAS, a drain contact (D), and a source contact (S) coupled to ground, and a second transistor 30 including a gate contact (G) that is left unconnected, a drain contact (D) coupled to the power supply modulation circuitry 20 and configured to receive the modulated power supply voltage M_VDD and provide the RF output signal RF_OUT, and a source contact (S) coupled to the drain contact (D) of the first transistor 28. The RF PA circuitry 18 shown in FIG. 7 operates as described above, wherein the first transistor 28 receives the RF input signal RF_IN and the modulated bias signal M_BIAS at the gate contact (G) and provides an amplified RF output signal RF_OUT at the drain contact (D) of the second transistor 30 using the modulated bias signal M_BIAS and the modulated power supply voltage M_VDD received at the drain contact (D). In one embodiment, the gate contact (G) of the second transistor 30 may receive an unmodulated bias signal BIAS.

Figure 8:
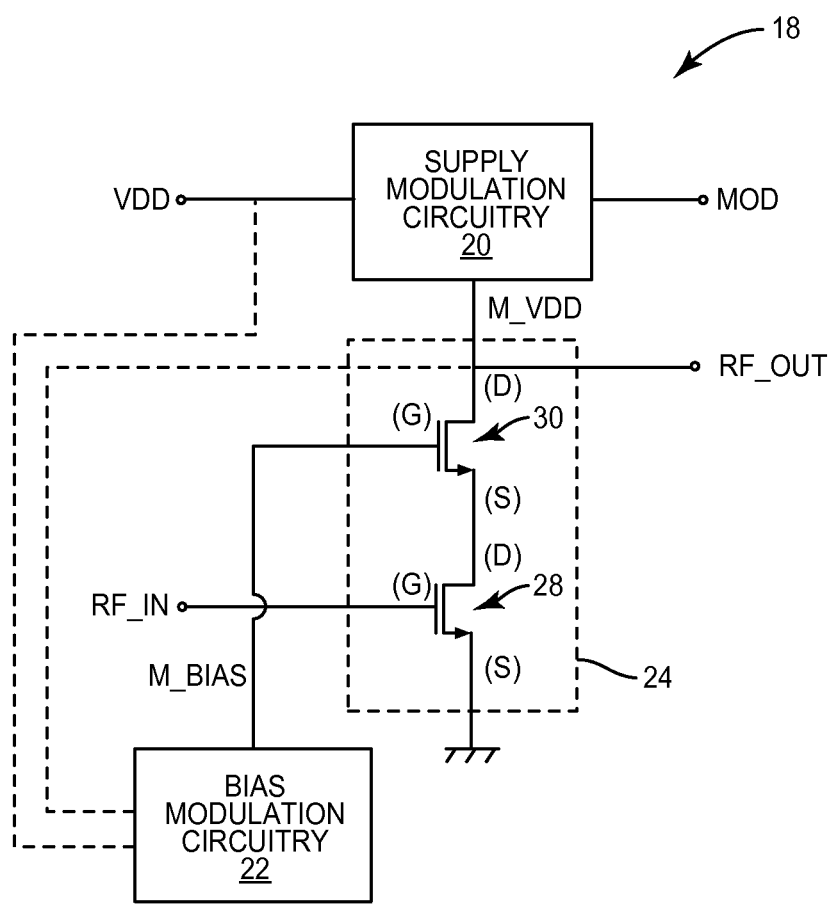
FIG. 8 is a schematic illustrating details of the RF PA circuitry shown in FIG. 5 according to an additional embodiment of the present disclosure.

FIG. 8 shows details of the amplifier stage 24 in the RF PA circuitry 18 according to an additional embodiment of the present disclosure. The amplifier stage 24 shown in FIG. 8 is substantially similar to that shown in FIG. 7, except that the bias modulation circuitry 22 is coupled to the gate contact (G) of the second transistor 30 rather than that of the first transistor 28. Accordingly, the first transistor 28 receives the RF input signal RF_IN and an unmodulated bias signal BIAS (which may be provided by separate bias circuitry) at its gate contact (G), while the second transistor 30 receives the modulated bias signal M_BIAS at its gate contact (G). In some embodiments, modulating the bias signal provided to the second transistor 30 rather than the first transistor 28 may be advantageous, however, the particular components in the amplifier stage 24 to which the modulated bias signal M_BIAS should be provided should be carefully considered based on the noise and other operating parameters of the amplifier stage 24.

Figure 9:
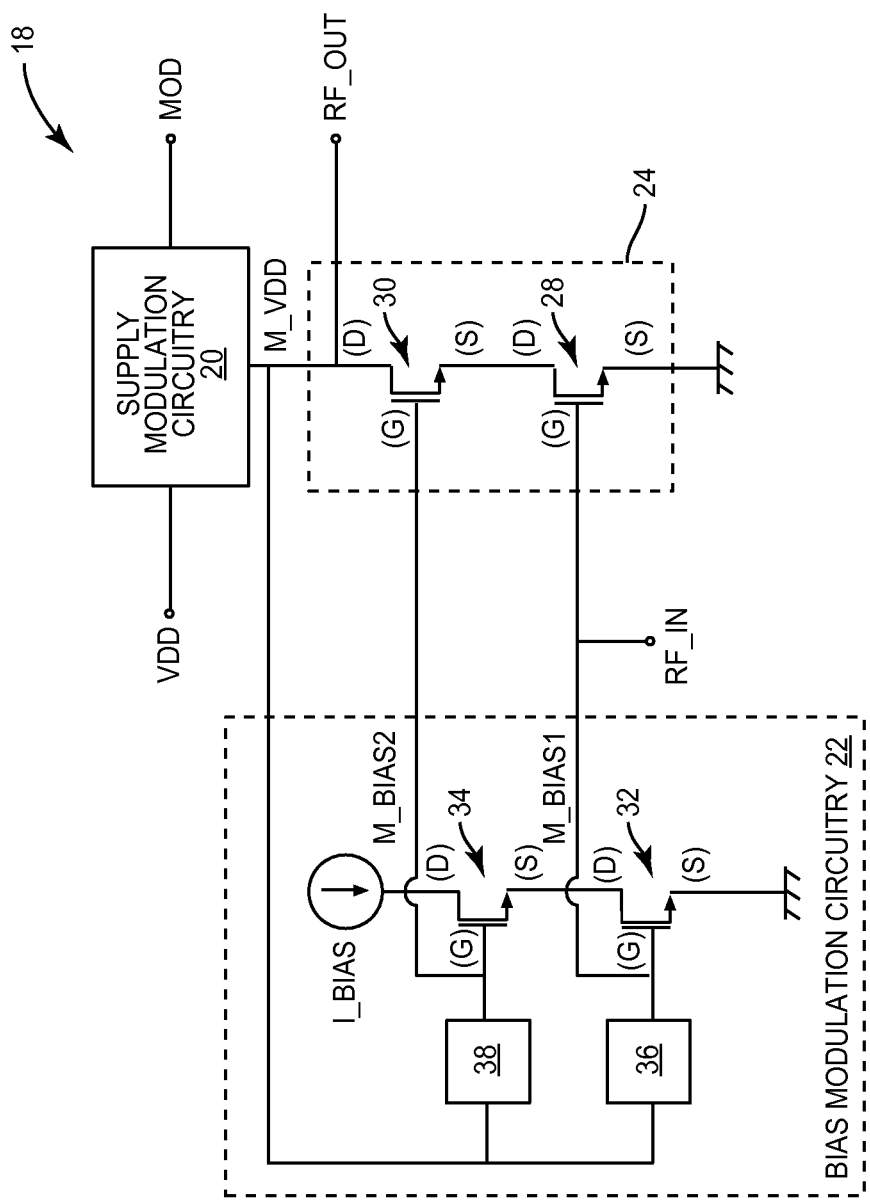
FIG. 9 is a schematic illustrating details of the RF PA circuitry shown in FIG. 5 according to an additional embodiment of the present disclosure.

FIG. 9 shows details of the amplifier stage 24 and the bias modulation circuitry 22 according to one embodiment of the present disclosure. The amplifier stage 24 is substantially similar to that shown in FIGS. 7 and 8, except that the bias modulation circuitry 22 is coupled to the gate contact (G) of both the first transistor 28 and the second transistor 30. Further, details of the bias modulation circuitry 22 are shown. The bias modulation circuitry 22 includes a bias current source I_BIAS, a first bias transistor 32, a second bias transistor 34, a first power supply voltage converter 36, and a second power supply voltage converter 38. In one embodiment, the first bias transistor 32 and the second bias transistor 34 are MOSFET devices, however, any transistor devices may be used for the first bias transistor 32 and the second bias transistor 34 without departing from the principles of the present disclosure. In the embodiment in which the first bias transistor 32 and the second bias transistor 34 are MOSFET devices, the first bias transistor 32 includes a gate contact (G) coupled to the power supply modulation circuitry 20 via the first power supply voltage converter 36, a drain contact (D) coupled to a source contact (S) of the second bias transistor 34, and a source contact (S) coupled to ground. The second bias transistor 34 includes a gate contact (G) coupled to the power supply modulation circuitry 20 via the second power supply voltage converter 38, a drain contact (D) coupled to the bias current source I_BIAS, and the source contact (S) coupled to the drain contact (D) of the first bias transistor 32. Further, the gate contact (G) of the first bias transistor 32 is coupled to the gate contact (G) of the first transistor 28 in the amplifier stage 24, while the gate contact (G) of the second bias transistor 34 is coupled to the second transistor 30 in the amplifier stage 24.

In operation, the amplifier stage 24 receives the RF input signal RF_IN at the gate contact (G) of the first transistor 28, amplifies the RF input signal RF_IN, and provides the amplified signal to the second transistor 30. The second transistor 30 further amplifies the signal to provide the RF output signal RF_OUT. The bias modulation circuitry 22 receives the modulated power supply voltage M_VDD at the first power supply voltage converter 36 and the second power supply voltage converter 38, and provides a first converted modulated supply voltage signal M_BIAS1 and a second converted modulated supply voltage signal M_BIAS2 to the gate contact (G) of the first bias transistor 32 and the second bias transistor 34, respectively. These converted modulated supply voltages are then delivered to the respective gate contacts (G) of the first transistor 28 and the second transistor 30 in the amplifier stage 24, such that the small signal gain of the amplifier stage 24 is maintained at a constant value.

The first power supply voltage converter 36 and the second power supply voltage converter 38 may be any suitable circuitry for converting the modulated power supply voltage M_VDD into a desired converted modulated supply voltage signal, the details of which are well known in the art and thus omitted in the present disclosure. In one embodiment, the first power supply voltage converter 36 and the second power supply voltage converter 38 provide a linear conversion of the modulated power supply voltage M_VDD. In additional embodiments, the first power supply voltage converter 36 and the second power supply voltage converter 38 provide a non-linear conversion of the modulated power supply voltage M_VDD.

Figure 10:
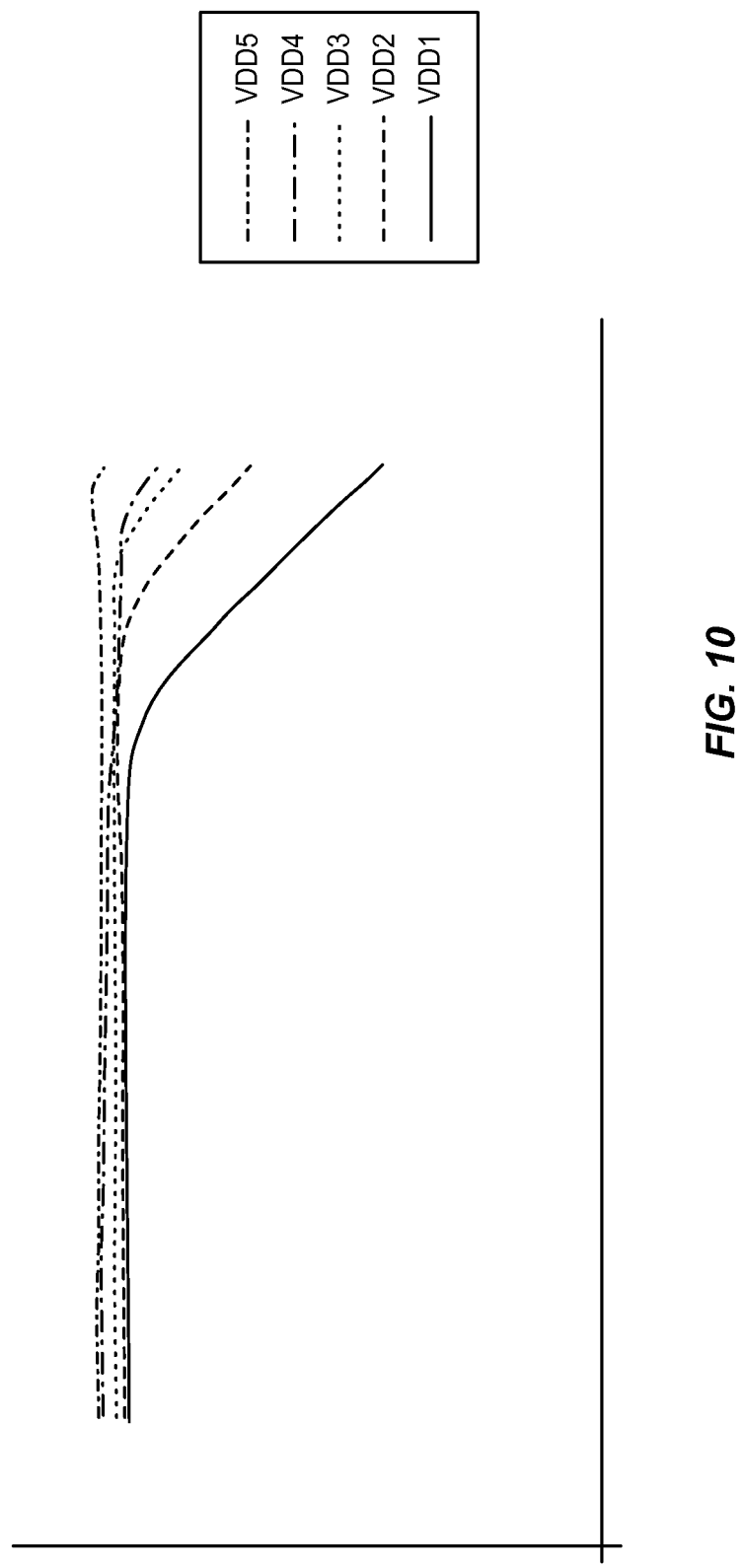
FIG. 10 is a graph illustrating a gain response of RF PA circuitry including gain modulation circuitry according to one embodiment of the present disclosure.

FIG. 10 is a graph illustrating improvements in the small signal gain of the amplifier stage 24 due to the bias modulation circuitry 22. As shown in FIG. 10, the small signal gain of the amplifier stage 24 is maintained at a relatively constant value over a variety of supply voltages delivered to the amplifier stage 24 due to the bias modulation circuitry 22. Accordingly, the predictability and thus performance of the RF PA circuitry 18 is significantly improved.

Figure 11:
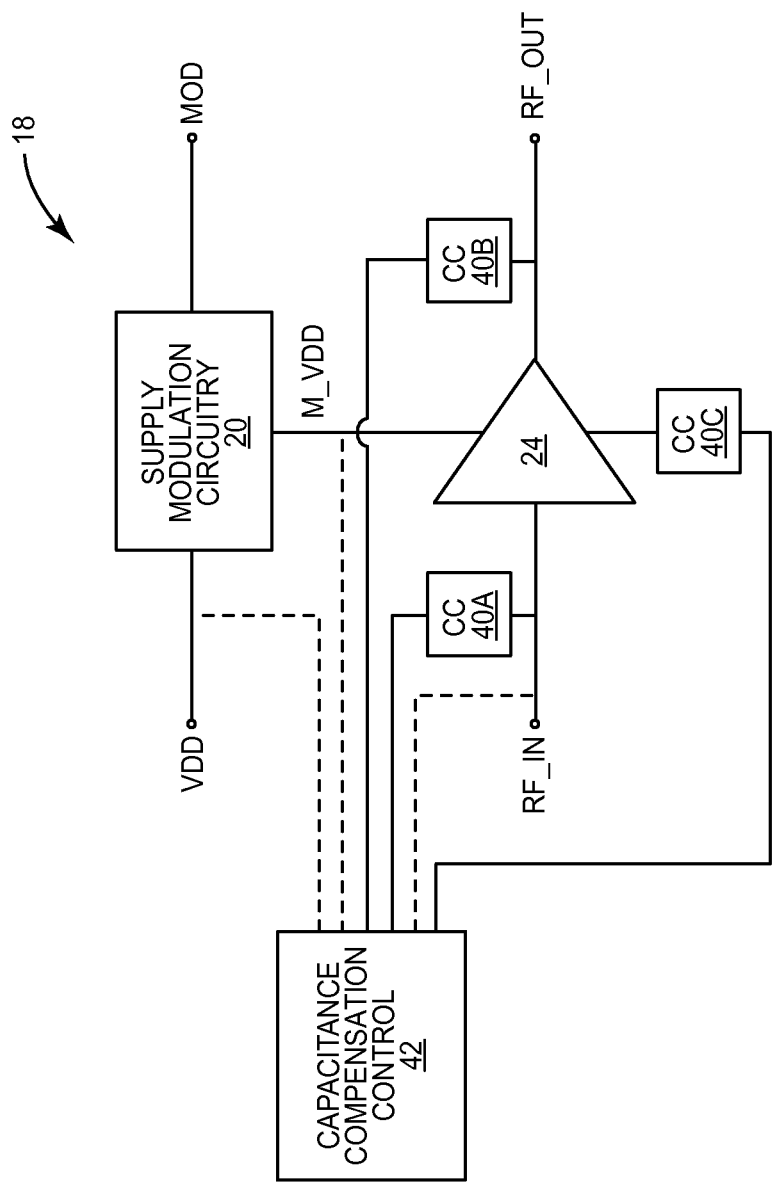
FIG. 11 is a schematic illustrating the RF PA circuitry including capacitance compensation circuitry according to one embodiment of the present disclosure.

While using the bias modulation circuitry 22 as described above results in improvements in the linearity of the RF PA circuitry 18, operating the amplifier stage 24 using the power supply modulation circuitry 20 may still cause changes in the phase of the RF input signal RF_IN as it is passed through the amplifier stage 24, thereby causing significant phase modulation (PM) to PM and/or AM to PM distortion. Accordingly, FIG. 11 shows capacitance compensation circuitry 40 and capacitance compensation control circuitry 42 for minimizing PM to PM and/or AM to PM distortion in the RF PA circuitry 18. The capacitance compensation circuitry 40 may be separated into first capacitance compensation circuitry 40A, second capacitance compensation circuitry 40B, and third capacitance compensation circuitry 40C. The first capacitance compensation circuitry 40A may be coupled to an input of the amplifier stage 24, the second capacitance compensation circuitry 40B may be coupled to an output of the amplifier stage 24, and the third capacitance compensation circuitry 40C may be coupled to one or more internal nodes of the amplifier stage 24.

The capacitance compensation control circuitry 42 is coupled to each one of the first capacitance compensation circuitry 40A and the second capacitance compensation circuitry 40B. The capacitance compensation control circuitry 42 may also be coupled to one or more of an input of the amplifier stage 24, the power supply voltage VDD, and the power supply modulation circuitry 20. Accordingly, the capacitance compensation control circuitry 42 may use one or more of the RF input signal RF_IN, the power supply voltage VDD, the modulated baseband control signal MOD, and the modulated power supply voltage M_VDD to determine the amount of capacitance compensation necessary to maintain the capacitance of the amplifier stage 24 at a constant value throughout changes in the modulated power supply voltage M_VDD. The capacitance compensation control circuitry 42 then provides a control signal to each one of the first capacitance compensation circuitry 40A and the second capacitance compensation circuitry 40B in order to provide a desired amount of compensation capacitance at the attachment point of the capacitance compensation circuitry 40, thereby maintaining a constant capacitance of the amplifier stage 24.

The capacitance compensation circuitry 40 may be any suitable component configured to present an adjustable capacitance. For example, the capacitance compensation circuitry 40 may include one or more varactors or one or more digitally programmable arrays of capacitors (DPACs). Depending on the type of capacitance compensation control circuitry 42, an analog or digital control signal may be provided by the capacitance compensation control circuitry 42 in order to adjust the capacitance presented by the capacitance compensation control circuitry 42. As discussed above, the capacitance of the capacitance compensation circuitry 40 is adjusted as to maintain a constant capacitance of the amplifier stage 24 over changes in the modulated power supply voltage M_VDD.

Figure 12:
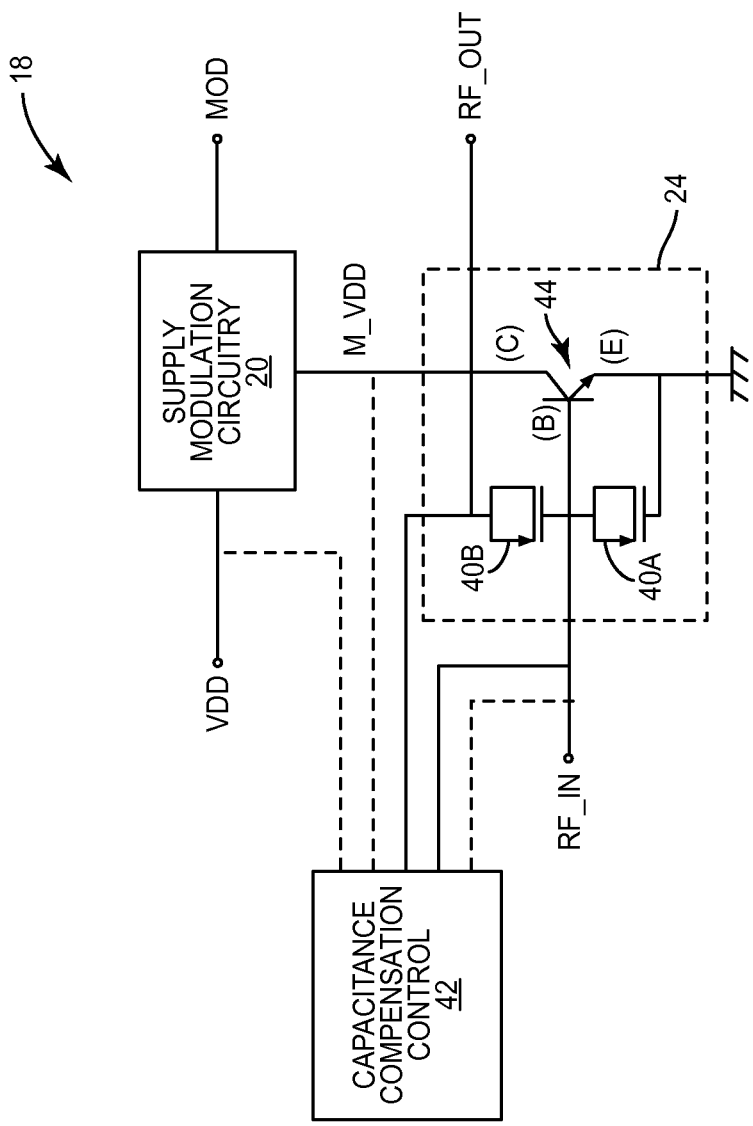
FIG. 12 is a schematic illustrating details of the RF PA circuitry shown in FIG. 11 according to one embodiment of the present disclosure.

FIG. 12 shows details of the RF PA circuitry 18 shown in FIG. 11 according to one embodiment of the present disclosure. As shown in FIG. 12, the amplifier stage 24 is a transistor 44. In one embodiment in which the transistor 44 is a BJT, the transistor 44 includes a base contact (B), a collector contact (C) coupled to the power supply modulation circuitry 20, and an emitter contact (E) coupled to ground. The first capacitance compensation circuitry 40A is coupled between the base contact (B) and the emitter contact (E) of the transistor 44, and the second capacitance compensation circuitry 40B is coupled between the base contact (B) and the collector contact (C) of the transistor 44. The capacitance compensation control circuitry 42 is coupled to the first capacitance compensation circuitry 40A and the second capacitance compensation circuitry 40B, and may further be coupled to the base contact (B) of the transistor 44, the power supply modulation circuitry 20, and the power supply voltage VDD. Accordingly, the capacitance compensation control circuitry 42 may receive one or more of the RF input signal RF_IN, the modulated power supply voltage M_VDD, the modulated baseband control signal MOD, and the power supply voltage VDD, and may provide control signals to the first capacitance compensation circuitry 40A and the second capacitance compensation circuitry 40B based thereon in order to maintain the capacitance of the amplifier stage 24 at a constant value.

Although the first capacitance compensation circuitry 40A and the second capacitance compensation circuitry 40B are shown as varactors in FIG. 12, the first capacitance compensation circuitry 40A and the second capacitance compensation circuitry 40B may also include DPACs, or any other adjustable capacitance components without departing from the principles described herein.

Figure 13:
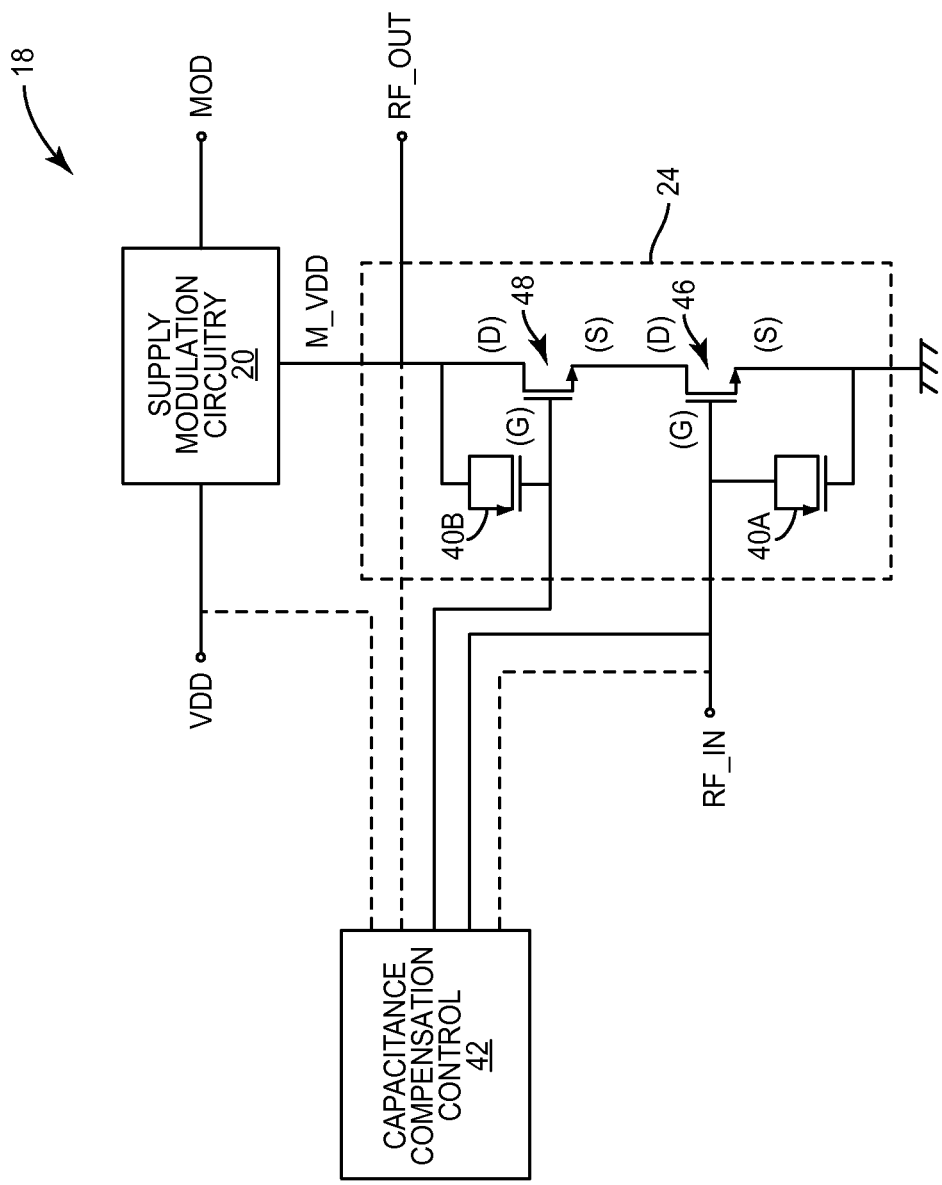
FIG. 13 is a schematic illustrating details of the RF PA circuitry shown in FIG. 11 according to an additional embodiment of the present disclosure.

FIG. 13 shows details of the RF PA circuitry 18 shown in FIG. 11 according to an additional embodiment of the present disclosure. As shown in FIG. 13, the amplifier stage 24 includes a first transistor 46 and a second transistor 48 coupled in cascode. The first transistor 46 includes a gate contact (G), a drain contact (D) coupled to a source contact (S) of the second transistor 48, and a source contact (S) coupled to ground. The second transistor 48 also includes a gate contact (G), a drain contact (D) coupled to the power supply modulation circuitry 20, and the source contact (S) coupled to the drain contact (D) of the first transistor 46. The first capacitance compensation circuitry 40A is coupled between the gate contact (G) and the source contact (S) of the first transistor 46. The second capacitance compensation circuitry 40B is coupled between the gate contact (G) and the drain contact (D) of the second transistor 48. The capacitance compensation control circuitry 42 is coupled to the gate contact (G) of both the first transistor 46 and the second transistor 48, and may further be coupled to the supply modulation circuitry 20 and the power supply voltage VDD. In various embodiments, the capacitance compensation circuitry 40 may be coupled to any portion of the amplifier stage 24.

As discussed above, the capacitance compensation control circuitry 42 may use one or more of the RF input signal RF_IN, the modulated power supply voltage M_VDD, the modulated baseband control signal MOD, and the power supply voltage VDD to determine a desired capacitance for the first capacitance compensation circuitry 40A and the second capacitance compensation circuitry 40B and provide a control signal thereto in order to maintain the capacitance of the amplifier stage 24 at a constant value.

Figure 14:
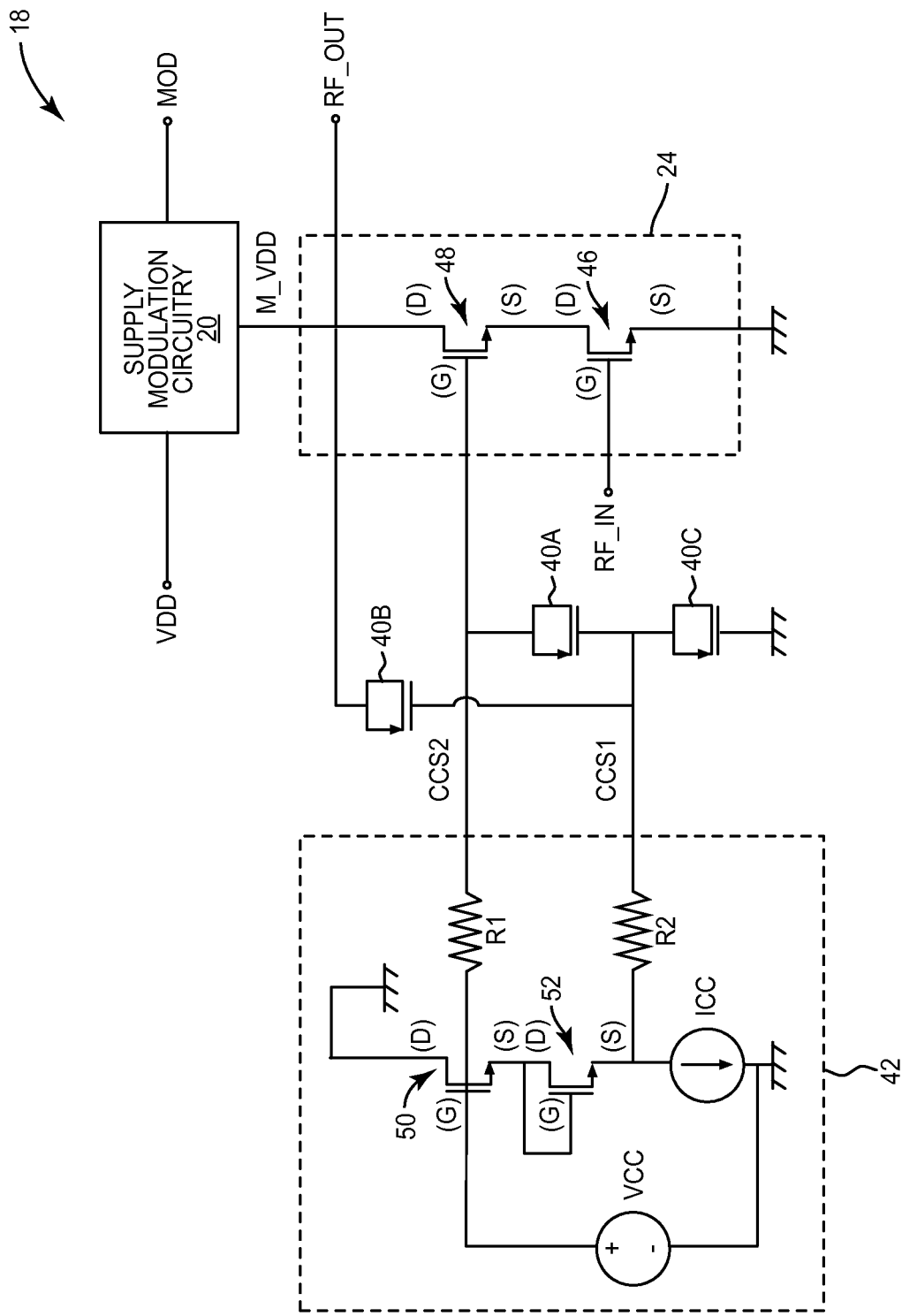
FIG. 14 is a schematic illustrating details of the RF PA circuitry shown in FIG. 11 according to an additional embodiment of the present disclosure.

FIG. 14 shows the RF PA circuitry 18 shown in FIG. 13 according to an additional embodiment of the present disclosure. The RF PA circuitry 18 shown in FIG. 14 is substantially similar to that shown in FIG. 13, except that the first capacitance compensation circuitry 40A is coupled between the gate contact (G) of the second transistor 48 and ground, the second capacitance compensation circuitry 40B is coupled between the drain contact (D) of the second transistor 48 and the third capacitance compensation circuitry 40C, and the third capacitance compensation circuitry 40C is coupled between the second capacitance compensation circuitry 40B and ground. Further, the details of the capacitance compensation control circuitry 42 are shown. The capacitance compensation control circuitry 42 includes a first capacitance compensation transistor 50, a second capacitance compensation transistor 52, a first capacitance compensation resistor R1, a second capacitance compensation resistor R2, a capacitance compensation current source ICC and a capacitance compensation voltage source VCC.

A gate contact (G) of the first capacitance compensation transistor 50 is coupled to the capacitance compensation voltage source VCC, a drain contact (D) of the first capacitance compensation transistor 50 is grounded, and a source contact (S) of the first capacitance compensation transistor 50 is coupled to a drain contact (D) of the second capacitance compensation transistor 52. A gate contact (G) of the second capacitance compensation transistor 52 is coupled to the drain contact (D) of the second capacitance compensation transistor 52, such that the second capacitance compensation transistor 52 is diode-connected. Further, a source contact (S) of the second capacitance compensation transistor 52 is coupled to the capacitance compensation current source ICC. The first capacitance compensation resistor R1 is coupled between the gate contact (G) of the first capacitance compensation transistor 50 and the first capacitance compensation circuitry 40A, such that the first capacitance compensation circuitry 40A is coupled between the first capacitance compensation resistor R1 and ground. The second capacitance compensation resistor R2 is coupled between the source contact (S) of the second capacitance compensation transistor 52 and the second capacitance compensation circuitry 40B, such that the second capacitance compensation circuitry 40B is coupled between the second capacitance compensation resistor R2 and the drain contact (D) of the second transistor 48.

In operation, the capacitance compensation control circuitry 42 generates a first capacitance compensation control signal CCS1 and a second capacitance compensation control signal CCS2, which are delivered to the first capacitance compensation circuitry 40A and the second capacitance compensation circuitry 40B, respectively. These capacitance compensation control signals set the respective capacitance values for the first capacitance compensation circuitry 40A, the second capacitance compensation circuitry 40B, and the third capacitance compensation circuitry 40C. As the RF input signal RF_IN is amplified by the first transistor 46 in the amplifier stage 24 and passed to the second transistor 48, the RF signal at the gate contact (G) and the drain contact (D) of the second transistor 48 further varies the capacitance of the first capacitance compensation circuitry 40A, the second capacitance compensation circuitry 40B, and the third capacitance compensation circuitry 40C such that the overall capacitance of the amplifier stage 24 remains constant.

Figure 15:
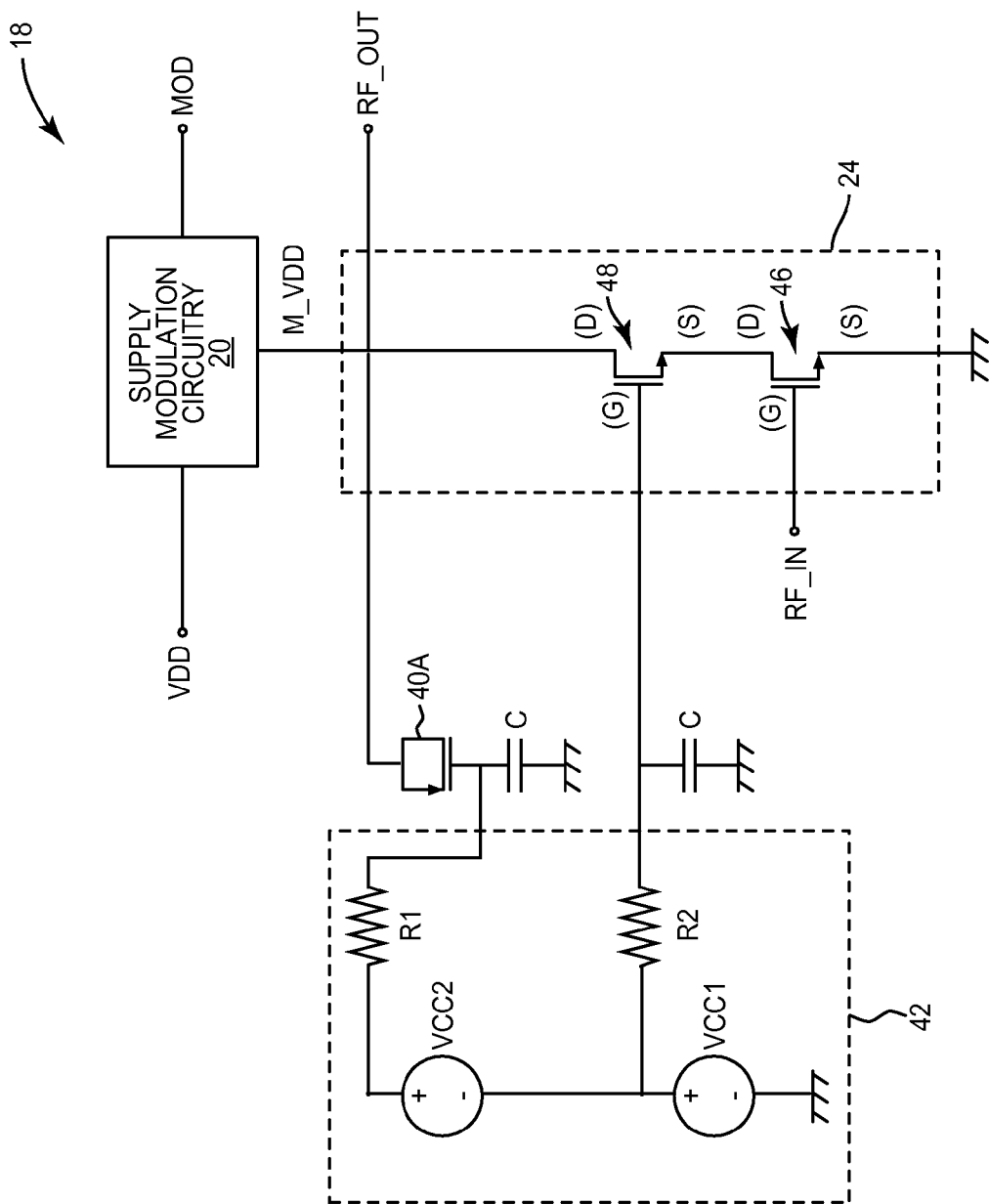
FIG. 15 is a schematic illustrating details of the RF PA circuitry shown in FIG. 11 according to an additional embodiment of the present disclosure.

FIG. 15 shows the RF PA circuitry 18 shown in FIG. 14 according to an additional embodiment of the present disclosure. The RF PA circuitry 18 shown in FIG. 15 is substantially similar to that shown in FIG. 14, but only includes the first capacitance compensation circuitry 40A coupled between a drain contact (D) of the second transistor 48 in the amplifier stage 24 and ground via a static capacitance C. Further, the capacitance compensation control circuitry 42 includes a first capacitance compensation voltage source VCC1, a second capacitance compensation voltage source VCC2, a first capacitance compensation resistor R1, and a second capacitance compensation resistor R2. The first capacitance compensation voltage source VCC1 is coupled in series with the second capacitance compensation voltage source VCC2 between ground and the first capacitance compensation resistor R1. Further, the first capacitance compensation resistor R1 is coupled to the first capacitance compensation circuitry 40A, such that the first capacitance compensation circuitry 40A is coupled between the first capacitance compensation resistor R1 and the drain contact (D) of the second transistor 48 in the amplifier stage 24. The second capacitance compensation resistor R2 is coupled between the first capacitance compensation voltage source VCC1 and the gate contact (G) of the second transistor 48 in the amplifier stage 24. An additional static capacitance C is coupled between the gate contact (G) of the second transistor 48 and ground. The capacitance compensation control circuitry 42 functions in a substantially similar manner as that discussed above, wherein the capacitance compensation control circuitry 42 delivers a capacitance compensation control signal CCS to the first capacitance compensation circuitry 40A in order to set a capacitance value thereof and maintain the capacitance of the amplifier stage 24 at a constant value throughout changes in the modulated supply voltage M_VDD.

Figure 16:
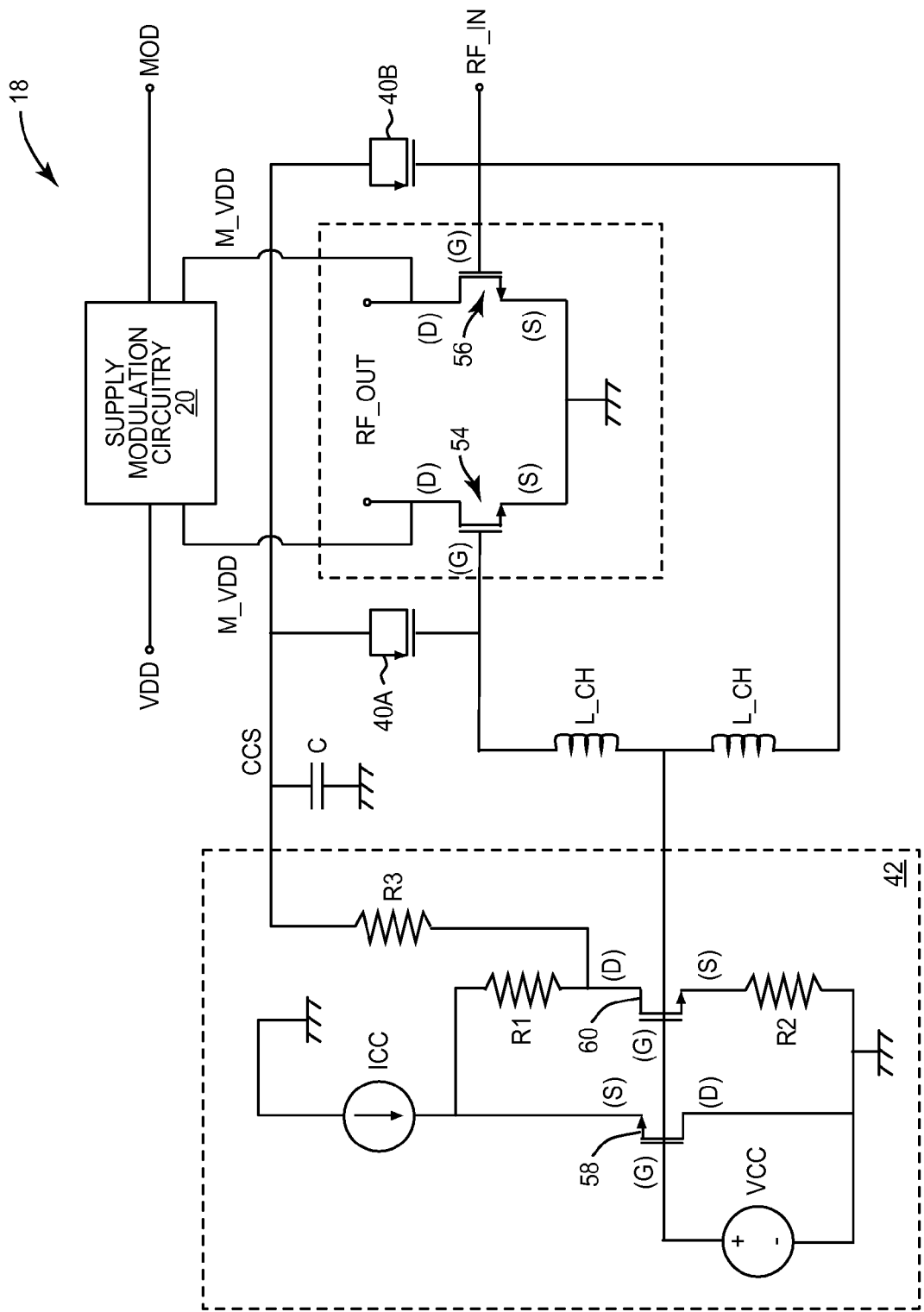
FIG. 16 is a schematic illustrating details of the RF PA circuitry shown in FIG. 11 according to one embodiment of the present disclosure.

FIG. 16 shows the RF PA circuitry 18 according to yet another embodiment of the present disclosure. As shown in FIG. 16, the amplifier stage 24 is a differential amplifier stage including a first transistor 54 and a second transistor 56 coupled in a differential fashion. In one embodiment, the first transistor 54 and the second transistor 56 are MOSFETs, however, any suitable transistor components may be used without departing from the principles of the present disclosure. In the embodiment in which the first transistor 54 and the second transistor 56 are MOSFETs, a gate contact (G) of the first transistor 54 and a gate contact (G) of the second transistor 56 are coupled via a pair of series coupled choke inductors L_CH to form a differential input, a drain contact (D) of the first transistor 54 and the second transistor 56 form a differential output, and a source contact (S) of the first transistor 54 and the second transistor 56 are grounded. The first capacitance compensation circuitry 40A is coupled to the gate contact (G) of the first transistor 54, while the second capacitance compensation circuitry 40B is coupled to the gate contact (G) of the second transistor 56. In one embodiment, the first transistor 54 and the second transistor 56 may be replaced with any number of cascode coupled stacked transistors.

The capacitance compensation control circuitry 42 includes a first capacitance compensation transistor 58, a second capacitance compensation transistor 60, a first capacitance compensation resistor R1, a second capacitance compensation resistor R2, a third capacitance compensation resistor R3, and a capacitance compensation current source ICC, and a capacitance compensation voltage source VCC. In one embodiment, the first capacitance compensation transistor 58 and the second capacitance compensation transistor 60 are MOSFET devices, however, any suitable transistor device may be used for the first capacitance compensation transistor 58 and the second capacitance compensation transistor 60 without departing from the principles of the present disclosure. In the embodiment in which the first capacitance compensation transistor 58 and the second capacitance compensation transistor 60 are MOSFET devices, the first capacitance compensation transistor 58 includes a gate contact coupled to the capacitance compensation voltage source VCC, a source contact (S) coupled to the capacitance compensation current source ICC, and a drain contact (D) coupled to ground. The second capacitance compensation transistor 60 includes a gate contact (G) coupled to the gate contact (G) of the first capacitance compensation transistor 58 and each one of the gate contacts (G) of the first transistor 54 and the second transistor 56 in the amplifier stage 24 via a respective choke inductor L_CH, a drain contact (D) coupled to the capacitance compensation current source ICC via the first capacitance compensation resistor R1, and a source contact (S) coupled to ground through the second capacitance compensation resistor R2. The first capacitance compensation circuitry 40A and the second capacitance compensation circuitry 40B are each coupled to the drain contact (D) of the second capacitance compensation transistor 60 via the third capacitance compensation resistor R3, such that the first capacitance compensation circuitry 40A is coupled between the third capacitance compensation resistor R3 and the gate contact (G) of the first transistor 54 in the amplifier stage 24 and the second capacitance compensation circuitry 40B is coupled between the third capacitance compensation resistor R3 and the gate contact (G) of the second transistor 56 in the amplifier stage 24. In some embodiments, an additional static capacitance C may be provided between the third capacitance compensation resistor R3 and the capacitance compensation circuitry 40, and ground.

In operation, the RF input signal RF_IN is provided across the gate contacts (G) of the first transistor 54 and the second transistor 56 in the amplifier stage. The RF input signal RF_IN is amplified and provided between the drain contacts (D) of the first transistor 54 and the second transistor 56 in the amplifier stage 24. The power supply modulation circuitry 20 receives a power supply voltage VDD and a baseband modulated control signal MOD and provides a modulated supply voltage M_VDD which is used for amplification of the RF input signal RF_IN. The capacitance compensation control circuitry 42 provides a capacitance control signal CCS to the first capacitance compensation circuitry 40A and the second capacitance compensation circuitry 40B in order to set a capacitance value thereof. Further, the RF input signal RF_IN provided across the differential input between the gate contacts (G) of the first transistor 54 and the second transistor 56 in the amplifier stage 24 varies a voltage across the first capacitance compensation circuitry 40A and the second capacitance compensation circuitry 40B such that the capacitance of the first capacitance compensation circuitry 40A and the second capacitance compensation circuitry 40B varies as a function of the RF input signal in order to maintain the capacitance of the amplifier stage 24 at a constant value.

Figure 17A:
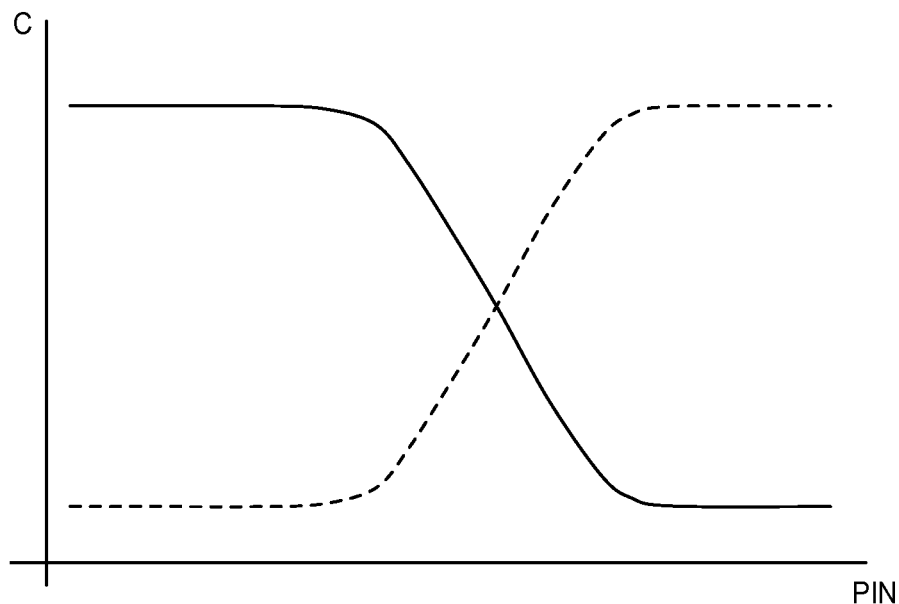
FIGS. 17A and 17B are graphs illustrating a capacitive correction provided to the RF PA circuitry according to one embodiment of the present disclosure.
Figure 17B:
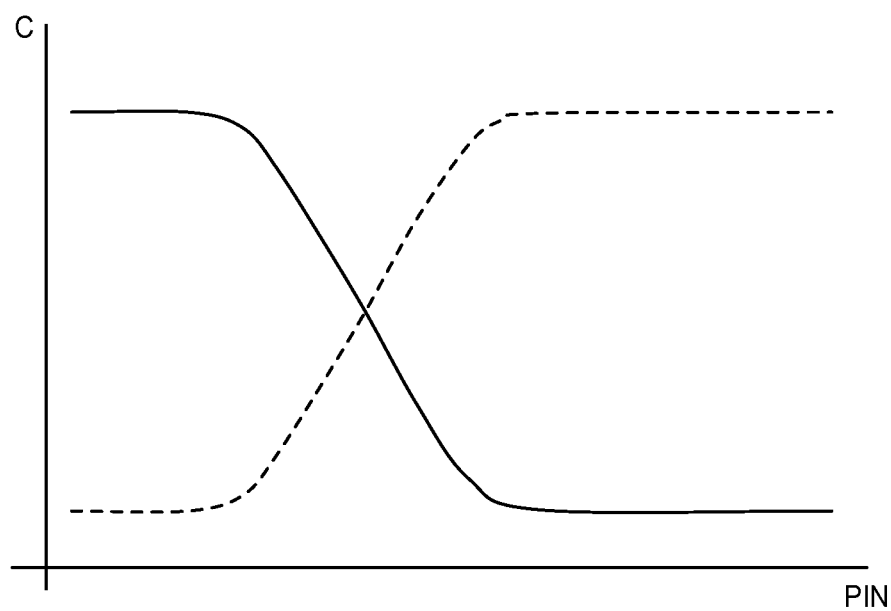

FIGS. 17A and 17B are graphs illustrating the capacitance correction provided by the capacitance compensation circuitry 40 and the capacitance compensation control circuitry 42 according to one embodiment of the present disclosure. In FIGS. 17A and 17B, the capacitance of the amplifier stage 24 is shown as a solid line, while the capacitance correction provided by the capacitance compensation circuitry 40 and the capacitance compensation control circuitry 42 is shown as a dotted line. As the capacitance of the amplifier stage 24 changes, the capacitance correction provided by the capacitance compensation circuitry 40 and the capacitance compensation control circuitry 42 changes in an equal but opposite fashion, directly tracking the changes in the capacitance of the amplifier stage 24. Accordingly, the capacitance of the amplifier stage 24 and the capacitance correction provided by the capacitance compensation circuitry 40 and the capacitance compensation control circuitry 42 cancel, thereby providing a capacitance that is substantially constant. In general, the capacitance compensation circuitry along with the capacitance compensation control circuitry 42 enables a tracking capacitance compensation that compensates over the design corners and supply conditions of the amplifier stage 24.

Those skilled in the art will recognize improvements and modifications to the embodiments of the present disclosure. All such improvements and modifications are considered within the scope of the concepts disclosed herein and the claims that follow.

What is claimed is:

1. Radio frequency (RF) power amplifier (PA) circuitry comprising:
    an amplifier element configured to amplify an RF input signal using a modulated power supply signal to produce an RF output signal;
    capacitance compensation circuitry coupled to the amplifier element;
    capacitance compensation control circuitry having a control output coupled to a control input of the capacitance compensation circuitry; and
    power supply modulation circuitry coupled to the amplifier element and the capacitance compensation control circuitry and configured to provide the modulated power supply signal to the amplifier element and the capacitance compensation control circuitry, wherein:
        the capacitance compensation control circuitry is configured to receive the modulated power supply signal and provide a control signal to the capacitance compensation circuitry that in response to the control signal presents a compensation capacitance to the amplifier element, and
        the compensation capacitance is a function of the modulated power supply signal such that the compensation capacitance is configured to compensate for changes in an internal capacitance of the amplifier element in order to maintain a phase of the RF output signal at a constant value as the modulated power supply signal changes.

2. The RF PA circuitry of claim 1 wherein the compensation capacitance is also a function of the RF input signal received by the amplifier element.

3. The RF PA circuitry of claim 1 wherein the compensation capacitance is linearly related to the modulated power supply signal.

4. The RF PA circuitry of claim 1 wherein the compensation capacitance is non-linearly related to the modulated power supply signal.

5. The RF PA circuitry of claim 1 wherein:
the power supply modulation circuitry is configured to receive the RF input signal; and
the modulated power supply signal is a function of the RF input signal.

6. The RF PA circuitry of claim 5 wherein the modulated power supply signal is an envelope power supply signal.

7. The RF PA circuitry of claim 1 wherein the amplifier element is a bipolar junction transistor (BJT).

8. The RF PA circuitry of claim 7 wherein the compensation capacitance is configured to compensate for changes in one or more of a base-emitter capacitance and a base-collector capacitance of the amplifier element as the modulated power supply signal changes.

9. The RF PA circuitry of claim 1 wherein the amplifier element comprises two transistors coupled in cascode.

10. The RF PA circuitry of claim 9 wherein the two transistors are metal-oxide-semiconductor field-effect transistors (MOSFETs).

11. The RF PA circuitry of claim 10 wherein the compensation capacitance is configured to compensate for changes in one or more of a gate-drain capacitance and a gate-source capacitance of the amplifier element as the modulated power supply signal changes.

12. The RF PA circuitry of claim 1 further comprising an additional amplifier element coupled in series with the amplifier element.

13. The RF PA circuitry of claim 12 wherein the amplifier element is a driver stage amplifier element and the additional amplifier element is an output stage amplifier element.

14. The RF PA circuitry of claim 12 wherein the amplifier element is an output stage amplifier element and the additional amplifier element is a driver stage amplifier element.

15. The RF PA circuitry of claim 1 wherein the capacitance compensation circuitry is coupled to the amplifier element and configured to present a compensation capacitance to the amplifier element, and further wherein the compensation capacitance is a function of the modulated power supply signal such that the compensation capacitance is configured to compensate for changes in an internal capacitance of the amplifier element in order to maintain a phase of the RF output signal at a constant value as the modulated power supply signal changes.

16. The RF PA circuitry of claim 1 wherein:
an operating range of the modulated power supply signal is between 0.1 V and a maximum available supply voltage; and
a phase variation of the RF output signal is less than 5° over the operating range of the modulated power supply signal.

* * * * *